United States Patent [19]
Tsai

[11] Patent Number: 5,428,502
[45] Date of Patent: Jun. 27, 1995

[54] KEYBOARD FRAME ASSEMBLY MOUNTING HARDWARE HAVING HOOKS, BRIDGE STRIPS, AND LOCATING STUB RODS

[75] Inventor: Ching-Cheng Tsai, Keelung, Taiwan

[73] Assignee: Chicony Electronics Co., Ltd., Taipei, Taiwan

[21] Appl. No.: 159,526

[22] Filed: Dec. 1, 1993

[51] Int. Cl.⁶ .................. H01H 9/00; G06F 1/16; F16B 1/00; H05K 7/02
[52] U.S. Cl. .................. 361/680; 248/225.2; 200/303
[58] Field of Search .......... 248/221.3, 222.1, 222.2, 248/225.2, 918; 200/303, 5 A; 235/145 R; 341/22; 345/168–172; 361/680; 364/708.1

[56] References Cited

U.S. PATENT DOCUMENTS

| Re. 32,977 | 7/1989 | Gotoh et al. | 200/5 A |
| 3,367,286 | 2/1968 | Jantzen | 248/222.2 X |
| 4,876,415 | 10/1989 | Clancy | 200/5 A |
| 5,001,307 | 3/1991 | Blaser | 200/5 A |
| 5,284,311 | 2/1994 | Baer | 248/222.2 X |
| 5,335,141 | 8/1994 | Hosoi | 361/680 |

Primary Examiner—Michael W. Phillips
Attorney, Agent, or Firm—Browdy and Neimark

[57] ABSTRACT

A keyboard frame assembly mounting hardware includes a base frame having a plurality of female fastening device at the top, a plurality of oblong guide holes and a locating hole spaced along the longitudinal center line thereof, each female fastening device having a bridge strip bridged over a square hole; and a key switch supporting frame having a plurality of male fastening devices at the bottom respectively fastened to the female fastening devices, and a plurality of locating stub rods respectively inserted into the oblong guide holes and said locating hole, each male fastening device having a hook hooked on the bridge strip of the respective female fastening device.

3 Claims, 10 Drawing Sheets

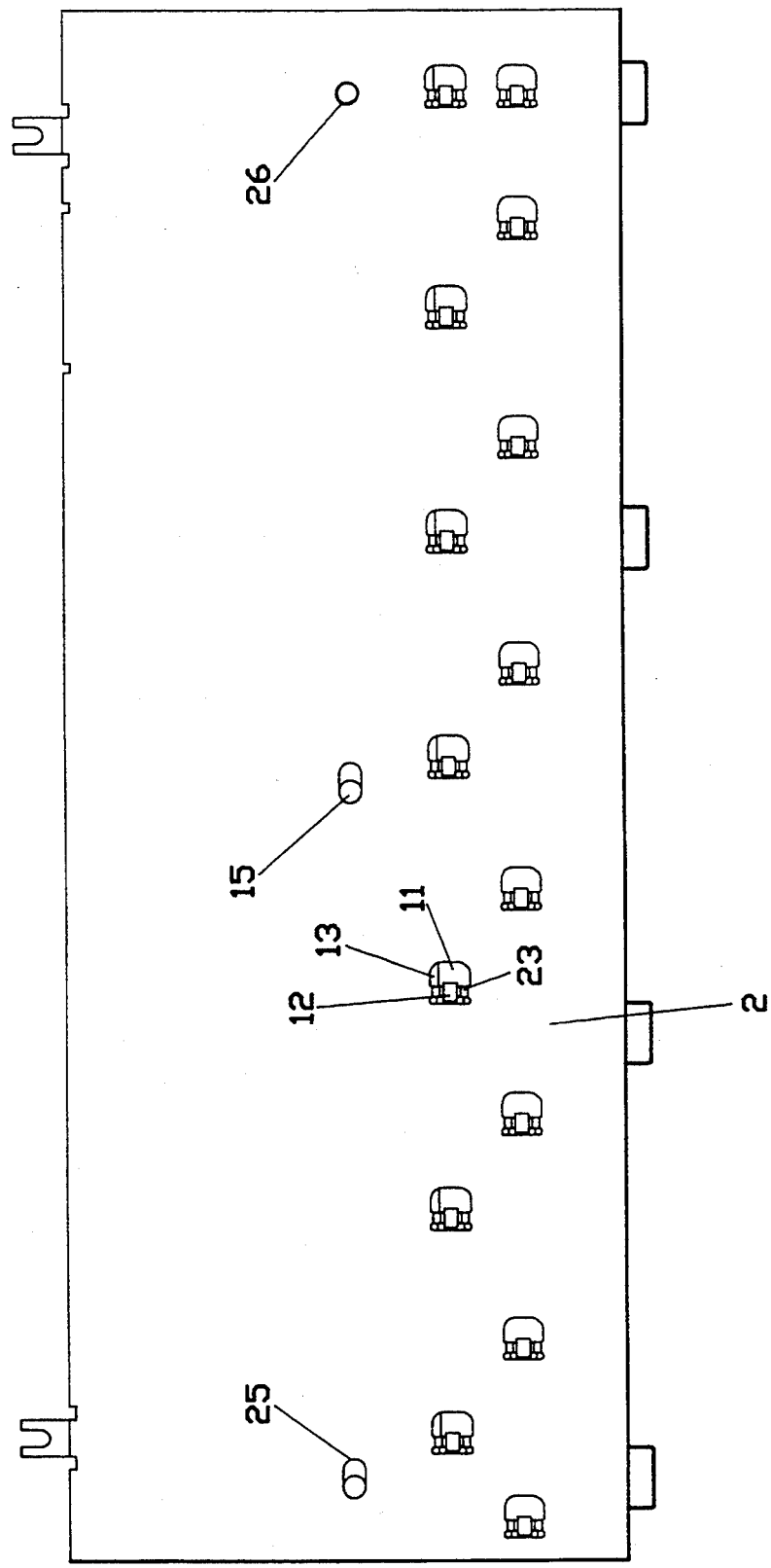

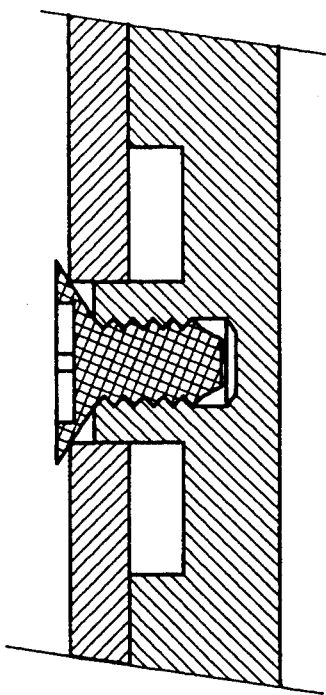
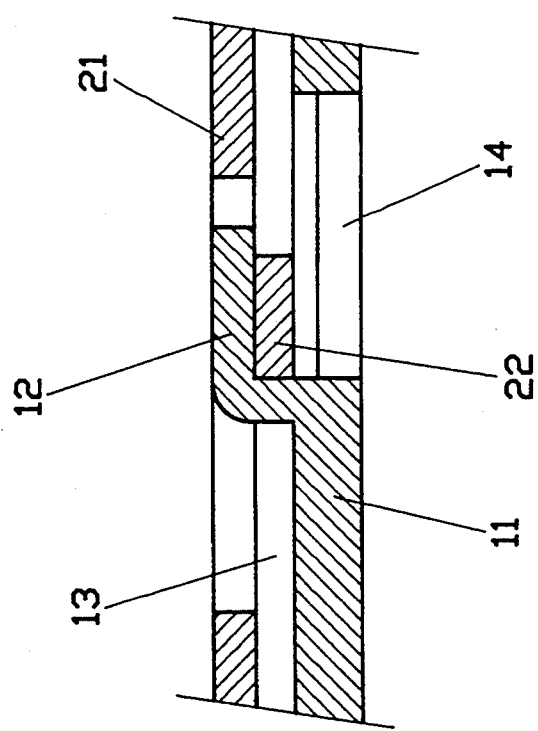

KEYBOARD FRAME ASSEMBLY MOUNTING HARDWARE HAVING HOOKS, BRIDGE STRIPS, AND LOCATING STUB RODS

BACKGROUND OF THE INVENTION

The present invention relates to a keyboard frame assembly mounting hardware for a computer keyboard which simplifies the assembly process of the computer keyboard and greatly reduces its height.

A variety of personal computers, from XT grade computers in early days to recent AT-486, 586 series, are well accepted and widely used in different fields. Recently, notebook computers have become more and more popular for the advantage of high mobility. In a normal notebook computer, the key switch supporting frame and base frame of the keyboard are fastened together by screws (see FIG. 1). Because screws are used to fasten the key switch supporting frame to the base frame, the assembly process of the keyboard is inconvenient. Because the screws must not protrude beyond the top surface of the key switch supporting frame so as not to interfere with the operation of the key switches, the screws must be completely received within the key switch supporting frame. However, in order to receive the screws, the thickness of the key switch supporting frame must be relatively increased, and therefore the total thickness of the keyboard cannot be reduced.

SUMMARY OF THE INVENTION

The present invention has been accomplished to provide a keyboard frame assembly mounting hardware which eliminates the aforesaid drawbacks. It is therefore the principal object of the present invention to provide a keyboard frame assembly mounting hardware which greatly reduces the thickness of the keyboard. It is another object of the present invention to provide a keyboard frame assembly mounting hardware which simplifies the assembly process of the keyboard.

According to one embodiment of the present invention, a plurality of oblong guide holes and a locating hole and a plurality of female fastening devices are made on the base frame at the top, a plurality of locating stub rods and male fastening devices are made on the key switch supporting frame at the bottom. The locating stub rods are respectively inserted into the oblong guide holes and the locating hole permitting the male fastening devices to fasten the female fastening devices respectively. Each female fastening device comprises a square hole and a bridge strip over the square hole. Each male fastening device comprises a square hole, which receive the bridge strip of the respective female fastening device, and a hook on one side of the respective square hole, which inserts into the square hole on the respective male fastening device and hooks on the respective bridge strip. Therefore, the arrangement of the male and female fastening devices does not increase the combined thickness of the key switch supporting frame and the base frame.

BRIEF DESCRIPTION OF THE DRAWINGS

FIG. 5 shows an alternate form of the present invention;

FIGS. 7 and 8 shows the thickness difference between the present invention and the prior art.

DETAILED DESCRIPTION OF THE PREFERRED EMBODIMENTS

Figure 1:
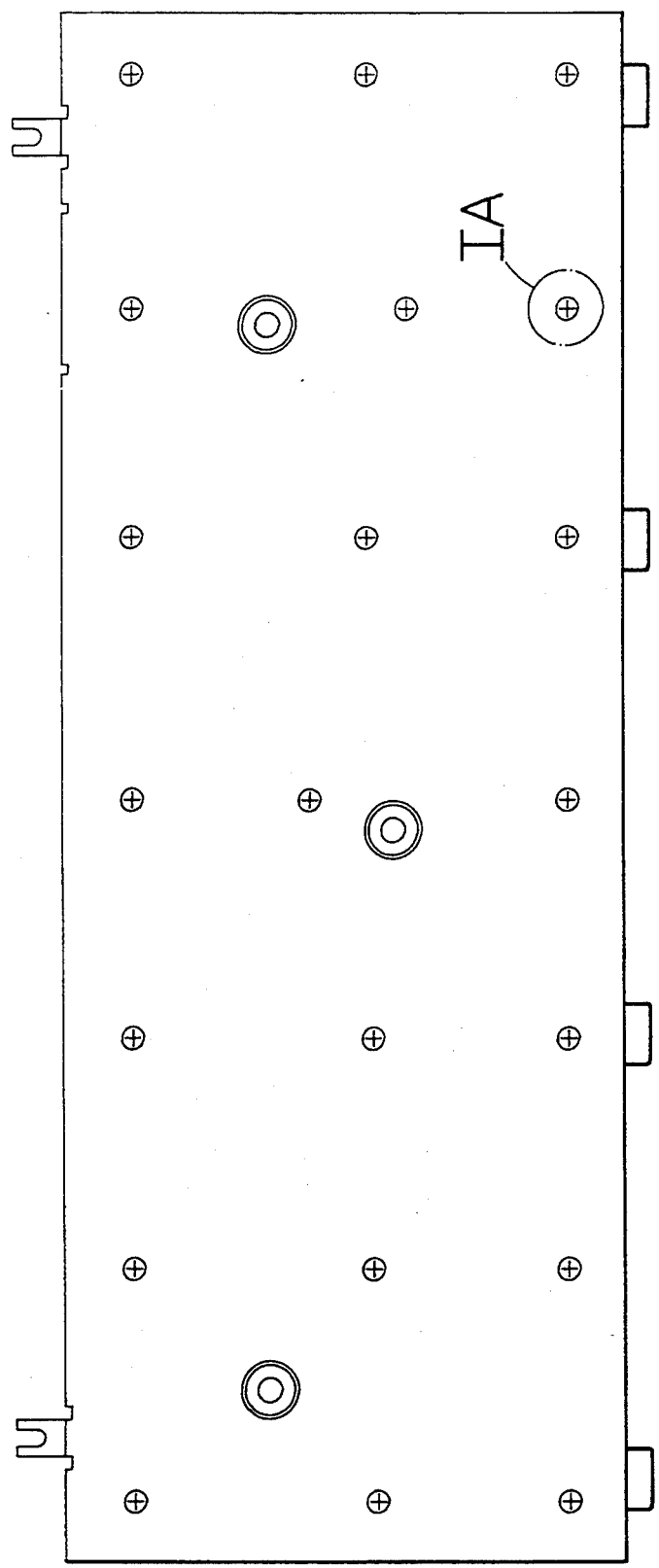
FIG. 1 shows a keyboard frame assembly mounting hardware according to the prior art.
Figure 1A:
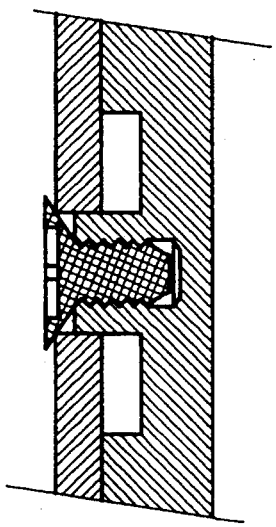
FIG. 1A is an enlarged sectional view of the encircled portion of FIG. 1 marked IA.
Figure 2:
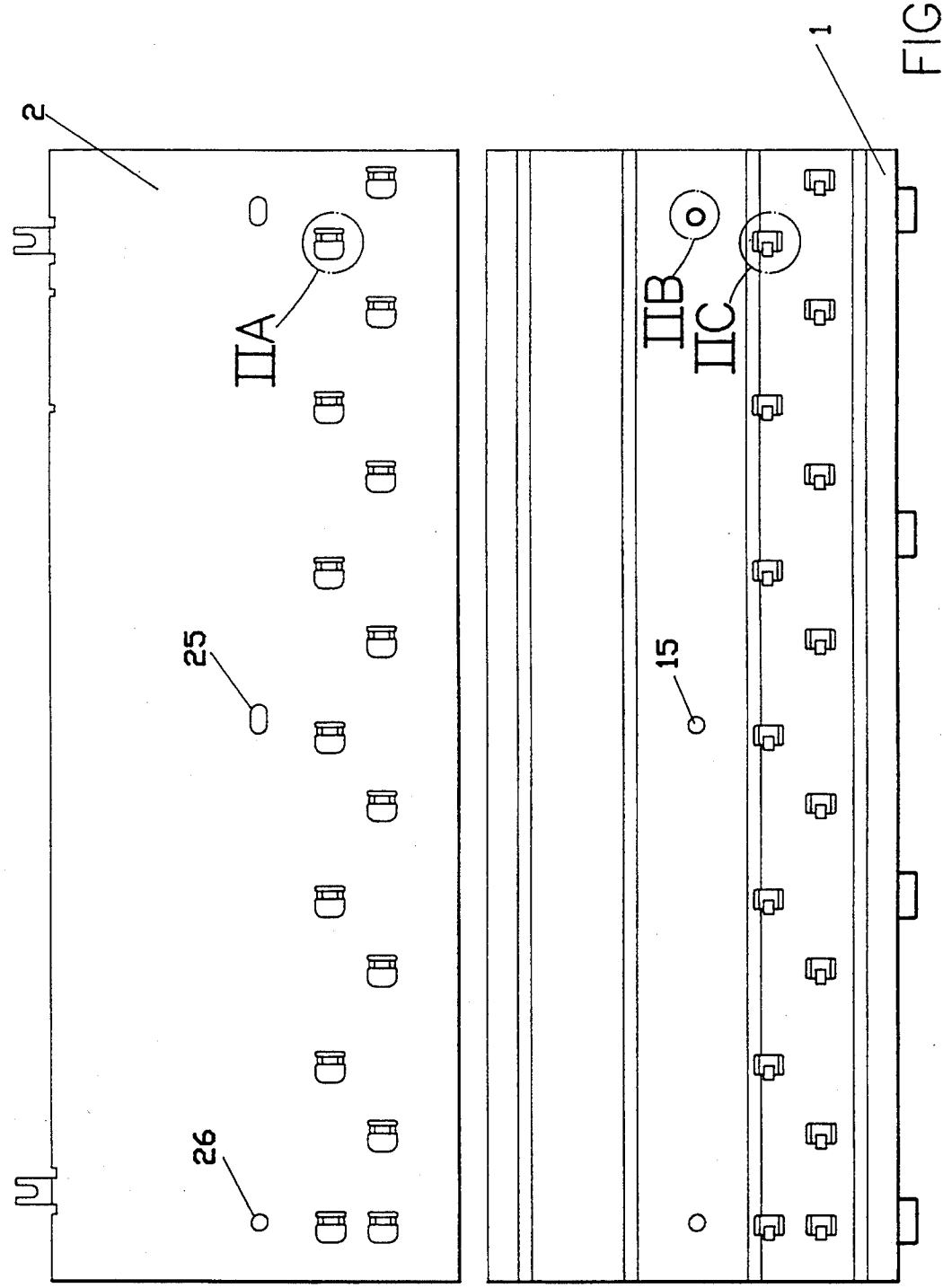
FIG. 2 is an exploded view of a keyboard frame assembly mounting hardware according to the preferred embodiment of the present invention.
Figure 2C:
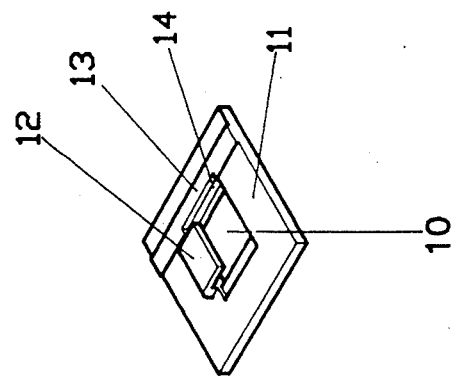
FIGS. 2A, 2B, and 2C are enlarged views of the encircled portions of FIG. 2 marked IIA, IIB, and IIC respectively.
Figure 2B:
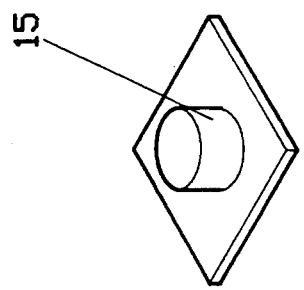
Figure 2A:
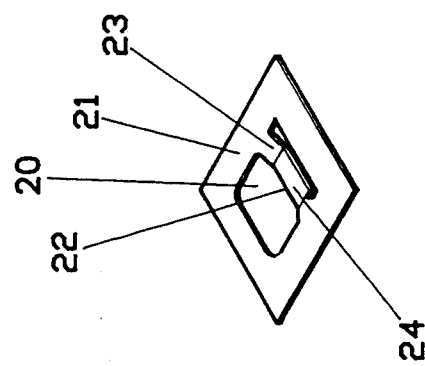

Referring to FIGS. 2–2C, a keyboard frame assembly mounting hardware in accordance with the present invention is generally comprised of a key switch supporting frame 1 for supporting a variety of key switches, and a base frame 2 connected to the key switch supporting frame 1 at the bottom. The key switch supporting frame 1 comprises a plurality of male fastening-devices 11 at the bottom, and a plurality of locating stub rods 15 raised from the bottom surface thereof and spaced along the longitudinal center line thereof. Each male fastening device 11 of the key switch supporting frame 1 comprises two parallel grooves 14 on two opposite side of the square hole 10 thereof, a hook 12 on one side of the square hole 10 between the parallel grooves 14, and a bumper 13 along one groove 14. The base frame 2 comprises a plurality of female fastening devices 21 at the top respectively connected to the male fastening devices 11 on the key switch supporting frame 1, a plurality of oblong guide holes 25 and a locating hole 26 spaced along the longitudinal center line thereof, which receive the locating stub rods 15 of the key switch supporting frame 1 respectively. Each female fastening device 21 of the base frame 2 comprises a square hole 20, a bridge strip 22 connected between two opposite sides of the square hole 20. The bridge strip 22 is comprised of two symmetrical sloping segments 23 respectively connected to either side of the square hole 20, and a flat middle segment 24 connected between the sloping segments 23 and disposed at a higher elevation than the top surface of the base frame 2.

Figure 3:
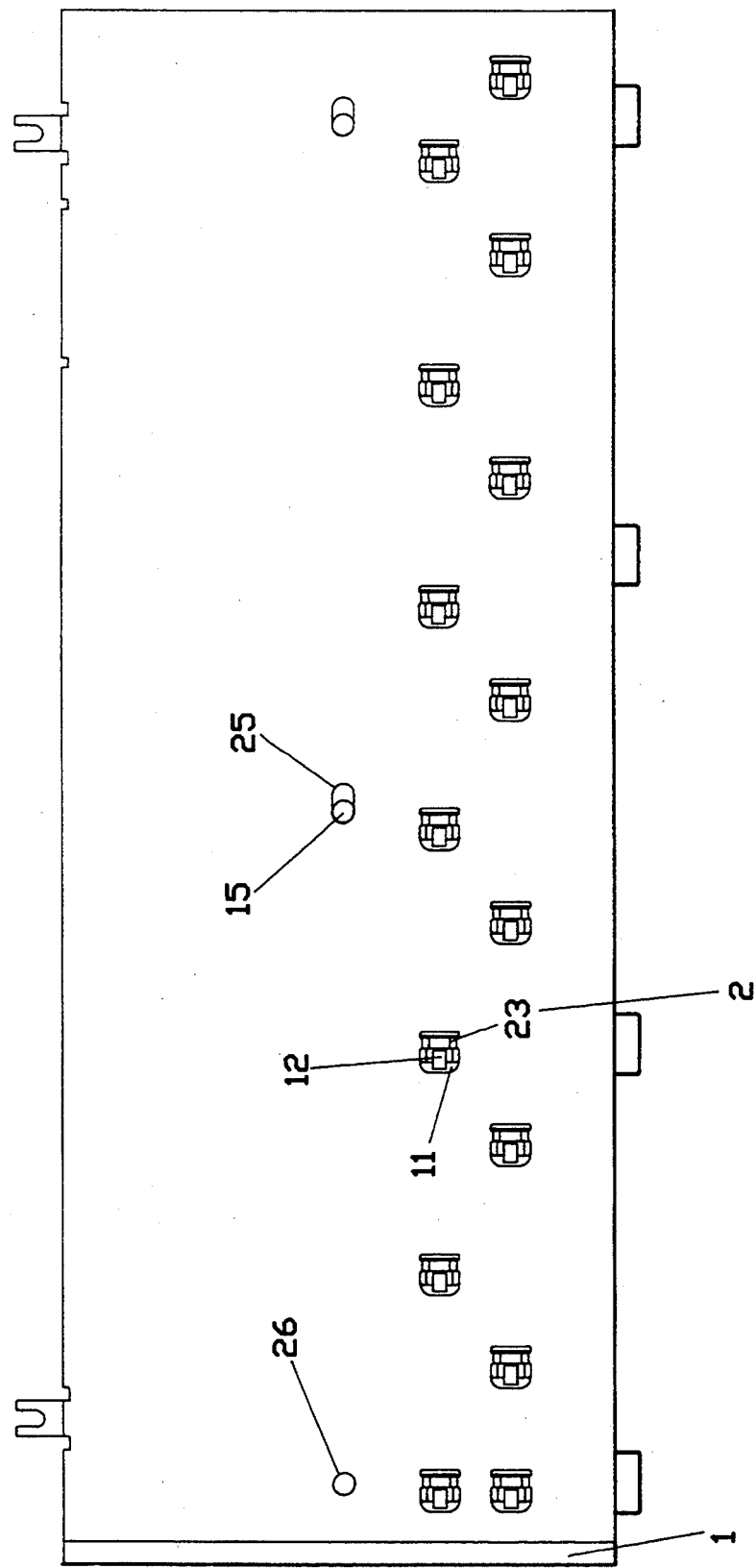
FIG. 3 is an assembly view of the keyboard frame assembly mounting hardware shown in FIG. 2.
Figure 4:
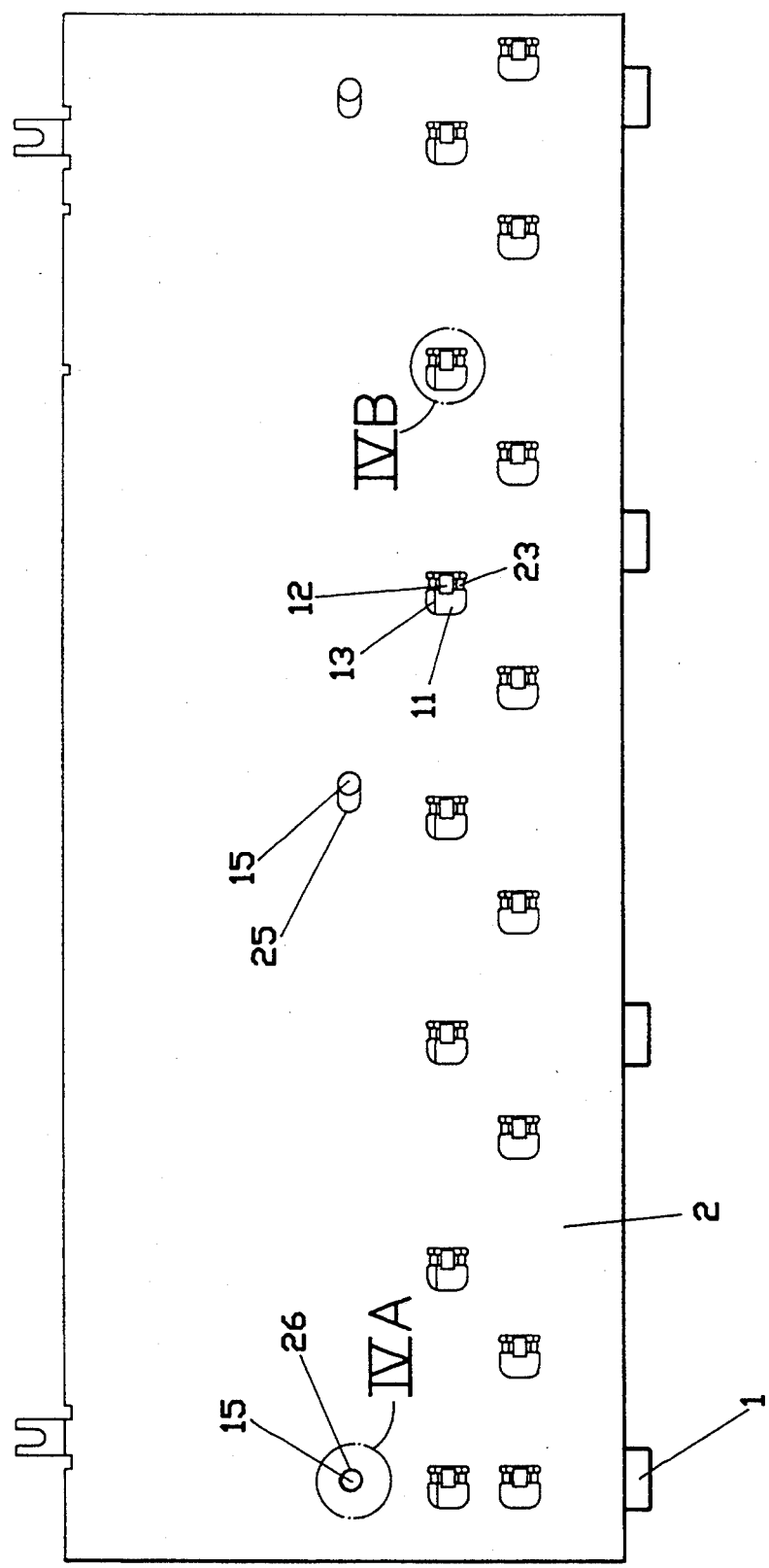
FIG. 4 shows the connection in detail between the key switch supporting frame and the base frame of FIG. 3.
Figure 4B:
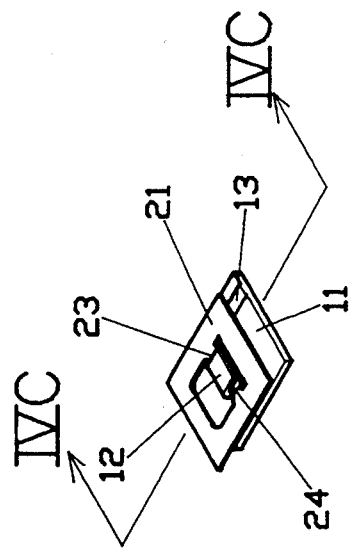
FIGS. 4A and 4B are enlarged views of the encircled portions of FIG. 4 marked IVA and IVB respectively.
Figure 4C:
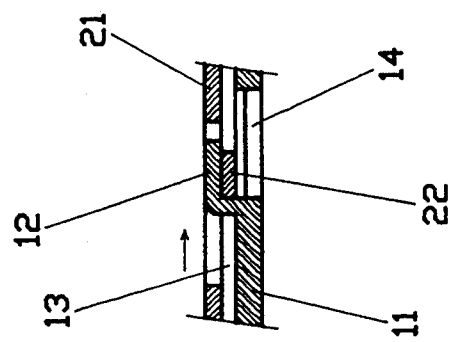
FIG. 4C is a sectional view of FIG. 4B taken along line IVC—IVC.
Figure 4A:
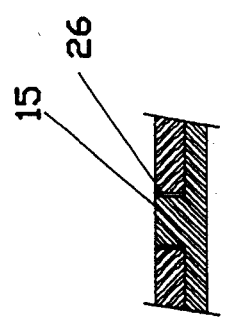

The assembly process of the keyboard frame assembly mounting hardware is quite simple and outlined hereinafter with reference to FIGS. 3 and 4–4C. The key switch supporting frame 1 is placed on the base frame 2 permitting the locating stub rods 15 to be respectively aimed at the oblong guide holes 25 and the locating hole 26, then the base frame 2 is moved on the key switch supporting frame 1 permitting the hook 12 of either male fastening device 11 to hook on the flat middle segment 24 of the bridge strip 22 of the respective female fastening device 21. The parallel grooves 14 and bumper 13 on either male fastening device 11 is to guide the two opposite sloping segments 23 of the bridge strip 22 on the respective female fastening device 2. When the hooks 12 of the male fastening devices 11 of the key switch supporting frame 1 respectively hook on the bridge strips 22 of the female fastening devices 22 of the base frame 2, the locating stub rods 15 of the key switch supporting frame 1 are respectively inserted into the oblong guide holes 25 and the locating hole 26, and therefore the key switch supporting frame 1 and the base frame 2 are fastened together. The width of the hook of a male fastening device is equal to the width of the flat middle segment of a respective female fastening device.

Figure 6:
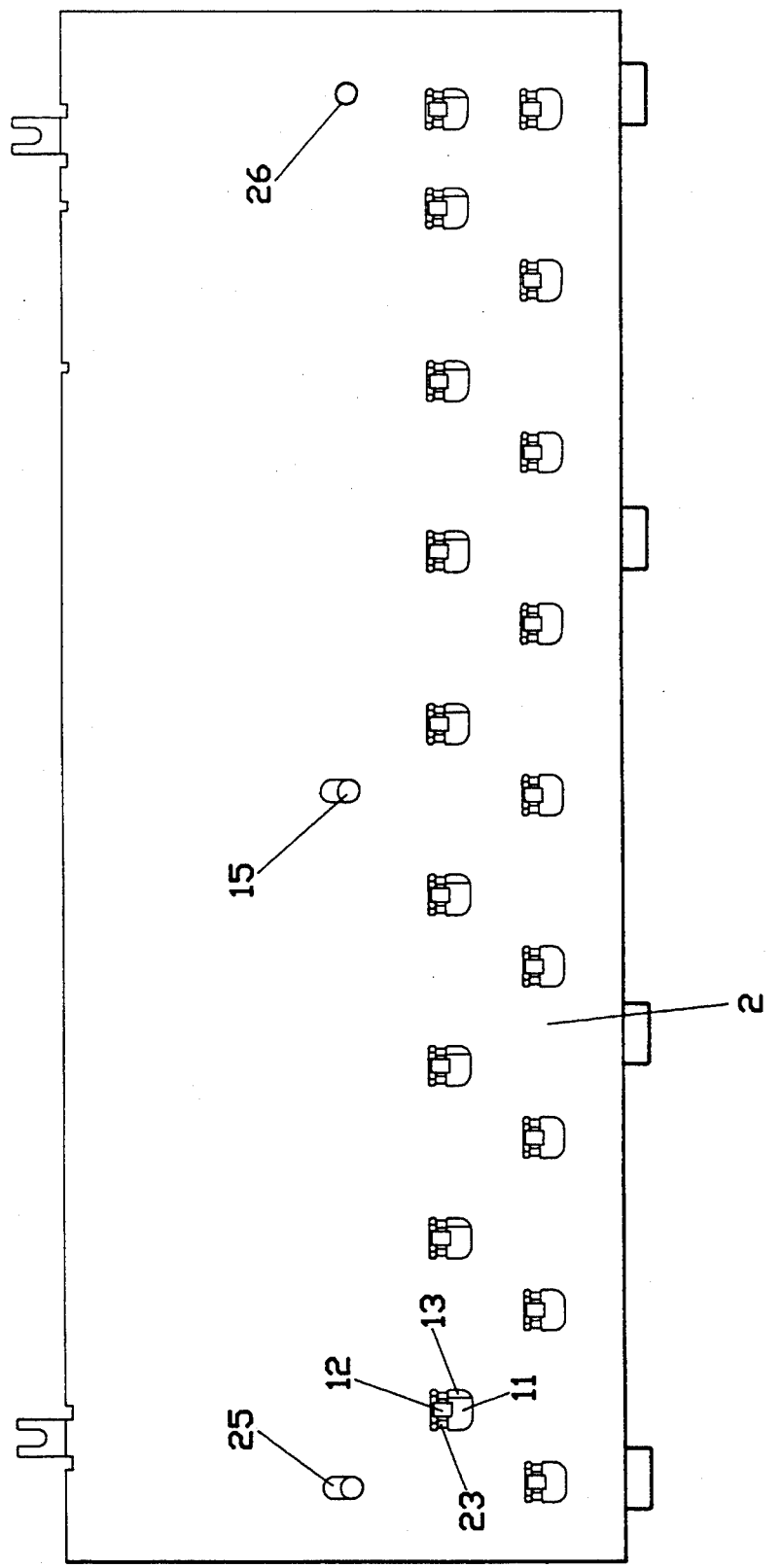
FIG. 6 shows still another alternate form of the present invention.

Referring to FIGS. 5 and 6, the hook 12 may be made at either side of the square hole 10. When the location of the hook 12 is changed, the location of the bridge strip 22 must be relatively changed.

Referring to FIGS. 7 and 8, as no screw hole is made on the key switch supporting frame 1 or the base frame 2, the total thickness of the keyboard frame assembly mounting hardware can be greatly reduced.

As indicated, the flat middle segment 24 of the bridge strip 22 rises above the base frame 2, and the hook 12 extends downwards from the key switch supporting frame 1 to the elevation of the top surface of the base frame 1, the connection between the male fastening devices 11 and the female fastening devices 22 does not increase the thickness of the keyboard frame assembly mounting hardware. Another feature of the present invention is that the arrangement of the oblong guide holes 25 and the locating hole 26. When the respective locating stub rods 15 are inserted into the oblong guide holes 25, the base frame 2 can still be moved relative to the key switch supporting frame 1 so that the hooks 12 of the male fastening devices 11 on the key switch supporting frame 1 can be accurately moved into respective positions to hook on the bridge strips 22 of the female fastening devices 21 on the base frame 2 respectively. When the hooks 12 respectively hook on the bridge strips 22, the other locating stub rod 15 becomes fitted into the locating hole 26, and therefore the base frame 2 and the key switch supporting frame 1 are fastened together. Still another feature of the present invention is that the locating of the hook 12 on each male fastening device 11 and the location of the bridge strip 22 on each female fastening device 22 can be relatively changed, so that the connection between the base frame 2 and the key switch supporting frame 1 can be made in either direction as desired.

It will be understood that numerous modifications and changes could be made to the aforedescribed embodiments without departing from the spirit and scope of the invention. Accordingly, the aforedescribed embodiments are intended for purpose of illustration and not as limitation.

What is claimed is:

1. A keyboard frame assembly mounting hardware comprising:

a base frame having a plurality of female fastening devices spaced on a top surface thereof, a plurality of oblong guide holes and a locating hole spaced along the longitudinal center line thereof, each female fastening device comprising a square hole, and a bridge strip connected between two opposite sides of the square hole of the respective female-fastening device, said bridge strip comprising two symmetrical sloping segments respectively connected to either side of the square hole of the respective female fastening device, and a flat middle segment connected between said sloping segments and disposed at a higher elevation than the top surface of said base frame; and a key switch supporting frame having a plurality of male fastening devices spaced on a bottom surface thereof and respectively fastened to said female fastening devices, and a plurality of locating stub rods raised from the bottom surface and spaced along the longitudinal center line thereof and respectively inserted into said oblong guide holes and said locating hole, each male fastening device comprising a square hole and a hook on one side of the square hole of the respective male fastening device, the hook of each male fastening device hooking on the flat middle segment of the bridge strip of the respective female fastening device.

2. The keyboard frame assembly mounting hardware of claim 1 wherein the width of the hook of either male fastening device is equal to that of the flat middle segment of the bridge strip of the respective female fastening device.

3. The keyboard frame assembly mounting hardware of claim 1 wherein each male fastening device further comprising two parallel grooves on two opposite sides of the square hole of the respective male fastening device at two opposite sides by the respective hook for sliding the sloping segments of the bridge strip of the respective female fastening device.

* * * * *